United States Patent
Lee

(10) Patent No.: US 8,237,284 B2
(45) Date of Patent: Aug. 7, 2012

(54) CONTACT PLUG OF SEMICONDUCTOR DEVICE AND METHOD OF FORMING THE SAME

(75) Inventor: Jung Woong Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 1076 days.

(21) Appl. No.: 12/163,735

(22) Filed: Jun. 27, 2008

(65) Prior Publication Data

US 2009/0127714 A1 May 21, 2009

(30) Foreign Application Priority Data

Nov. 20, 2007 (KR) ........................ 10-2007-0118590

(51) Int. Cl.
*H01L 21/44* (2006.01)
*H01L 23/48* (2006.01)
(52) U.S. Cl. ................. 257/774; 257/E21.585; 438/672
(58) Field of Classification Search .................. 257/774, 257/E21.476, E23.01, 621, E21.597, E21.585, 257/E21.577, E21.578, E23.145; 438/672, 438/637–640, 668
See application file for complete search history.

(56) References Cited

U.S. PATENT DOCUMENTS

| | | | | |
|---|---|---|---|---|
| 5,858,874 A * | 1/1999 | Shoji | ............................ | 438/626 |
| 2002/0155714 A1* | 10/2002 | Suzuki | .......................... | 438/689 |
| 2003/0003711 A1* | 1/2003 | Modak | ......................... | 438/629 |
| 2003/0036260 A1* | 2/2003 | Nakamura | .................... | 438/622 |
| 2005/0263876 A1* | 12/2005 | Yew et al. | ..................... | 257/701 |
| 2006/0024950 A1 | 2/2006 | Choi et al. | | |
| 2007/0082482 A1 | 4/2007 | Lee | | |
| 2007/0155162 A1* | 7/2007 | Lee | .............................. | 438/624 |

FOREIGN PATENT DOCUMENTS

KR 1020050029517 A 3/2005

* cited by examiner

*Primary Examiner* — Victor A Mandala
*Assistant Examiner* — Selim Ahmed
(74) *Attorney, Agent, or Firm* — Kilpatrick Townsend & Stockton LLP

(57) ABSTRACT

The present invention relates to a contact plug of a semiconductor device and a method of forming the same. The method includes forming an insulating layer over a semiconductor substrate, forming contact holes in the insulating layer, forming a first conductive layer over the insulating layer including the contact holes, etching the first conductive layer so that the first conductive layer remains at lower portions of the contact holes, wherein the insulating layer is also etched in order to widen upper widths of the contact holes, and forming a second conductive layer over the first conductive layer of the contact holes, thus forming the contact plugs.

16 Claims, 6 Drawing Sheets

CONTACT PLUG OF SEMICONDUCTOR DEVICE AND METHOD OF FORMING THE SAME

CROSS-REFERENCES TO RELATED APPLICATIONS

The present application claims priority to Korean patent application No. 10-2007-118590, filed on Nov. 20, 2007, which is incorporated by reference in its entirety.

BACKGROUND OF THE INVENTION

The present invention relates to a contact plug of a semiconductor device and, more particularly, to a method of forming the contact plug, which can prevent defects from occurring when contact holes are gap-filled with a conductive material.

Flash memory semiconductor devices are one type of non-volatile memory which can retain its data when power is turned off. Flash memory can be electrically programmed and erased and does not need the refresh function for rewriting data at periodic intervals. This flash memory device is largely classified into NOR flash memory and NAND flash memory depending on the structure and operating conditions of a cell. NOR flash memory has a plurality of word lines connected in parallel and enables program and erase on a specific address. Thus, the NOR flash memory is generally used for application fields requiring high-speed operation. On the contrary, NAND flash memory has a structure in which a plurality of memory cell transistors are connected in series to thereby form one string and is generally used for application fields needing highly-integrated data retention.

In a NAND flash memory, a semiconductor substrate having the source/drain regions formed therein and source/drain contact plugs connecting metal lines are generally formed by forming an insulating layer between the semiconductor substrate and the metal lines, forming contact holes in the insulating layer, and gap-filling the contact holes with a conductive material to thereby form the source/drain contact plugs. However, as memory becomes highly integrated and ultra-miniaturized, the width of the contact hole is gradually narrowed. Thus, bowing can be generated when forming the contact hole, or an overhang profile can occur while the contact holes are gap-filled with the conductive material, so that a seam is generated within the contact plugs. In particular, this overhang profile can be generated when depositing a barrier metal layer on the contact holes. An upper portion of the contact hole is narrowed due to the overhang profile of the barrier metal layer. Consequently, when the barrier metal layer is formed within the contact holes in a subsequent process, a seam is generated within the contact plugs. The seam generated as described above becomes even larger in a subsequent etch or polishing process, which may result in reliability problems.

BRIEF SUMMARY OF THE INVENTION

The present invention is directed to a contact plug of a semiconductor device and a method of forming the same, in which in an etch process of a conductive material layer gap-filled into contact holes formed in an insulating layer, an etch process of also etching the insulating layer is carried out in order to widen upper portions of the contact holes and to facilitate the process of gap-filling the contact holes with the conductive material.

According to an aspect of the present invention, there is provided a method of forming a contact plug of a semiconductor device, including forming an insulating layer over a semiconductor substrate, forming contact holes in the insulating layer, forming a first conductive layer over the insulating layer including the contact holes, etching the first conductive layer so that the first conductive layer remains at lower portions of the contact holes, wherein the insulating layer is also etched in order to widen upper widths of the contact holes, and forming a second conductive layer over the first conductive layer of the contact holes, thus forming the contact plugs.

The insulating layer can be formed of an oxide layer. The first conductive layer can be formed from polysilicon. The process of etching the first conductive layer and the insulating layer can be performed in a state where an etch selectivity of polysilicon and an etch selectivity of the oxide layer is in the range of 3:1 to 6:1. The process of etching the first conductive layer and the insulating layer can be performed using a mixed gas of $Cl_2$ gas, HBr gas and $O_2$. The method can further include forming an etch passivation layer on sidewalls of upper portions of exposed contact holes after the first conductive layer is etched. The etch passivation layer can be formed of a PE (Plasma Enhanced)-nitride layer or a LP (Low Pressure)-nitride layer. The method can further include forming a barrier metal layer on sidewalls of upper portions of exposed contact holes after the first conductive layer is etched. The barrier metal layer can be formed of a stacked layer of Ti/TiN. The method can further include forming an etch-stop layer over the semiconductor substrate before the insulating layer is formed. The etch-stop layer can be formed of a LP nitride layer or a PE nitride layer. The insulating layer can be formed of a HDP (High Density Plasma) oxide layer or a PETEOS (Plasma Enhanced Tetreathylorthosilicate) oxide layer. When forming the contact holes, a mixed gas of gases $C_xF_y$, Ar and $O_2$ can be used. The formation of the contact holes can further include forming a hard mask on the insulating layer, forming a passivation layer on the hard mask, and forming contact holes through which junctions formed in the semiconductor substrate are exposed by etching a part of the hard mask, the passivation layer and the insulating layer.

According to another aspect of the present invention, there is provided a contact plug of a semiconductor device, including an insulating layer formed over a semiconductor substrate, a contact hole formed in the insulating layer and having an upper width wider than a lower width, a first conductive layer formed at a lower portion of the contact hole, and a second conductive layer formed over the first conductive layer.

An etch passivation layer formed between the insulating layer and the second conductive layer can be further included. A barrier metal layer formed between the insulating layer and the second conductive layer can be further included.

DESCRIPTION OF SPECIFIC EMBODIMENTS

A specific embodiment according to the present invention will be described with reference to the accompanying drawings. However, the present invention is not limited to the disclosed embodiment, but may be implemented in various manners. The embodiment is provided to complete the disclosure of the present invention and to allow those having ordinary skill in the art to understand the scope of the present invention. The present invention is defined by the category of the claims.

FIGS. 1A to 1K are sectional views illustrating a method of forming a contact plug of a semiconductor device according to the present invention.

Figure 1A:
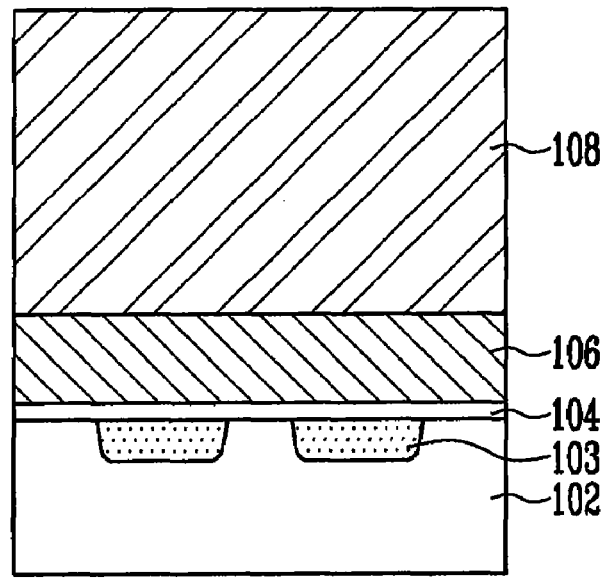
FIGS. 1A to 1K are sectional views illustrating a method of forming a contact plug of a semiconductor device according to the present invention.

Referring to FIG. 1A, a buffer layer 104 is formed on a semiconductor substrate 102 in which several components, such as a transistor or a flash memory cell (not shown), and junctions 103 such as a source region or a drain region, are formed through typical processes. The buffer layer 104 functions as a protective barrier to prevent the semiconductor substrate 102 from being damaged in a subsequent contact hole etch process and can be formed of an oxide layer. On the buffer layer 104 is formed an etch-stop layer 106. The etch-stop layer 106 functions as an etch stopper in a subsequent contact hole etch process. The etch-stop layer 106 can be formed of a LP (Low Pressure)-nitride layer, which is formed using a LPCVD (Low Pressure Chemical Vapor Deposition) method or a PE (Plasma Enhanced)-nitride layer, which is formed using a PECVD (Plasma Enhanced CVD) method and can be formed to a thickness of 200 to 600 angstroms. On the etch-stop layer 106 is formed an insulating layer 108. The insulating layer 108 can be formed to a thickness of 5000 to 10000 angstroms. The insulating layer 108 can be formed of an oxide layer, for example, a HDP (High Density Plasma) oxide layer or a PETEOS (Plasma Enhanced Tetreathylorthosilicate) oxide layer.

Figure 1B:
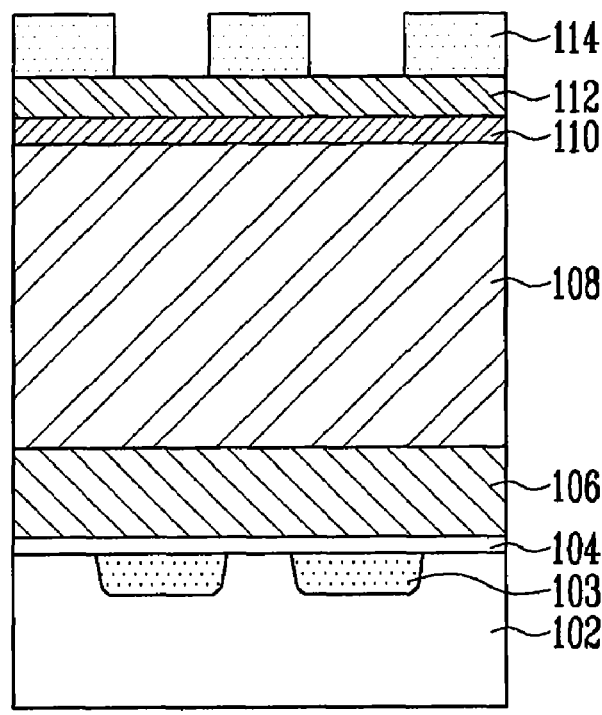

Referring to FIG. 1B, a hard mask 110 used in a subsequent etch process is formed on the insulating layer 108. The hard mask 110 can be formed from amorphous carbon. Here, amorphous carbon can be formed to a thickness of 1000 to 3000 angstroms using a CVD method in a temperature range of 250 to 600 degrees Celsius. A passivation layer 112 is formed on the hard mask 110. The passivation layer 112 functions to protect the hard mask 110 when a rework process is performed for removing subsequent photoresist patterns and reforming the photoresist patterns. The passivation layer 112 can be formed of a SiON layer having a thickness of 300 to 600 angstroms. On the passivation layer 112 a photoresist layer is formed. Exposure and development processes, etc. are performed to thereby form photoresist patterns 114. The photoresist patterns 114 are formed to have open regions where contact plugs will be formed.

Figure 1C:
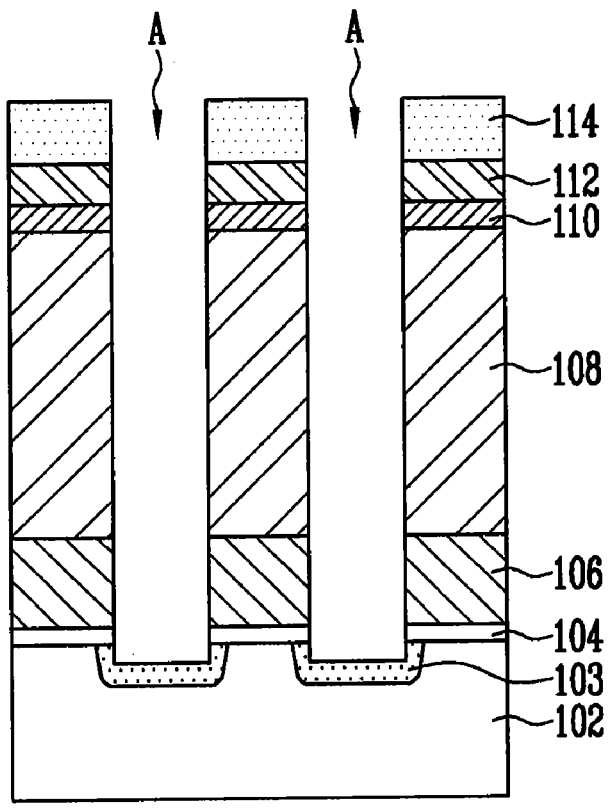

Referring to FIG. 1C, contact holes A are formed by etching the passivation layer (refer to 112 FIG. 1B), the hard mask 110, the insulating layer 108, the etch-stop layer 106 and the buffer layer 104 using an etch process employing the photoresist patterns (refer to 114 of FIG. 1B). A part of the semiconductor substrate 102 (for example, the junctions 103) is exposed at the bottom of the contact hole A. Here, the etch process of forming the contact holes A can be performed using a mixed gas of $C_xF_y$-based gas, an inert gas and $O_2$. The $C_xF_y$-based gas can include any one of gases $C_4F_6$, $C_4F_8$, and $C_3F_8$, and the inert gas can include Ar gas.

Meanwhile, during the etch process of forming the contact holes A, the photoresist patterns (refer to 114 of FIG. 1B) and the passivation layer (refer to 112 of FIG. 1B) can be etched and removed at the same time. If the photoresist patterns (refer to 114 of FIG. 1B) and the passivation layer (refer to 112 of FIG. 1B) remain, a process of removing them can be performed additionally.

Figure 1D:
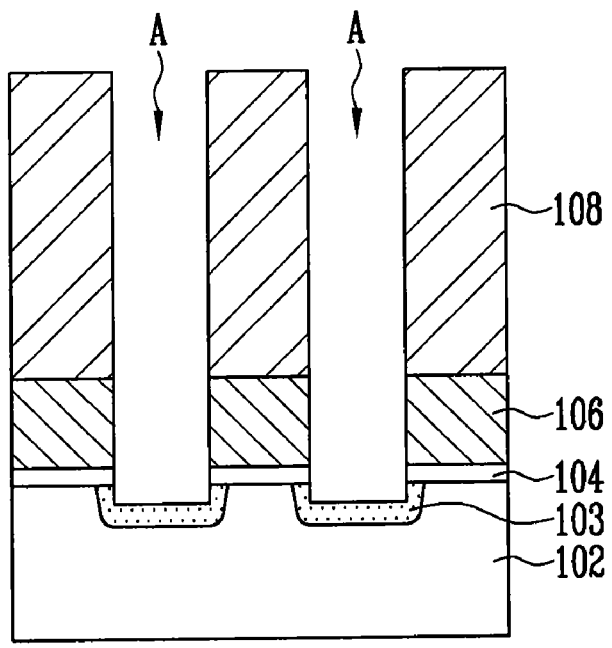

Referring to FIG. 1D, in order to remove the hard mask (refer to 110 of FIG. 1C), an ashing process is performed on the semiconductor substrate 102. Impurities formed on the semiconductor substrate 102 are removed by performing a cleaning process.

Figure 1E:
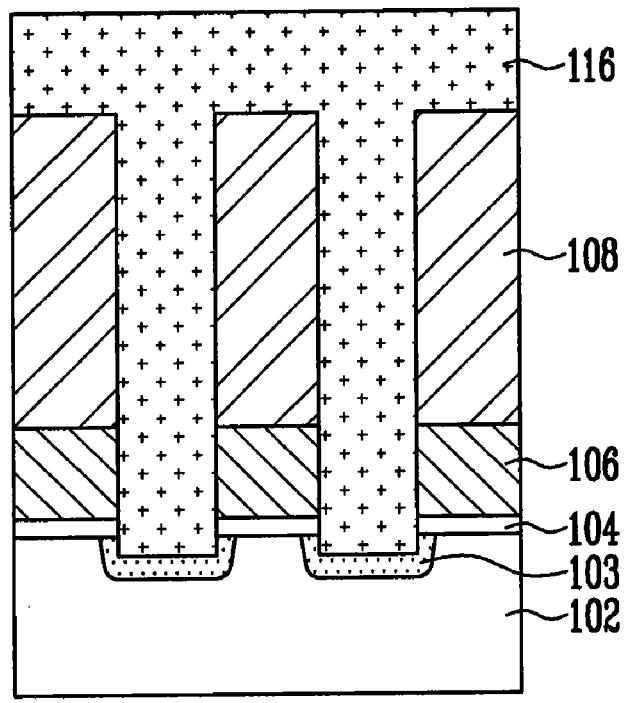

Referring to FIG. 1E, a first conductive layer 116 is formed over the semiconductor substrate 102 including the contact holes (refer to A of FIG. 1D). The first conductive layer 116 is formed as a part of a contact plug that is formed by gap-filling the contact hole and can be formed of polysilicon. Here, polysilicon can be formed using a CVD method in a temperature range of 450 to 600 degrees Celsius. The first conductive layer 116 can be formed on the insulating layer 108 to a thickness, which can gap-fill the contact holes A, for example, to a thickness of 1000 to 2000 angstroms.

Figure 1F:
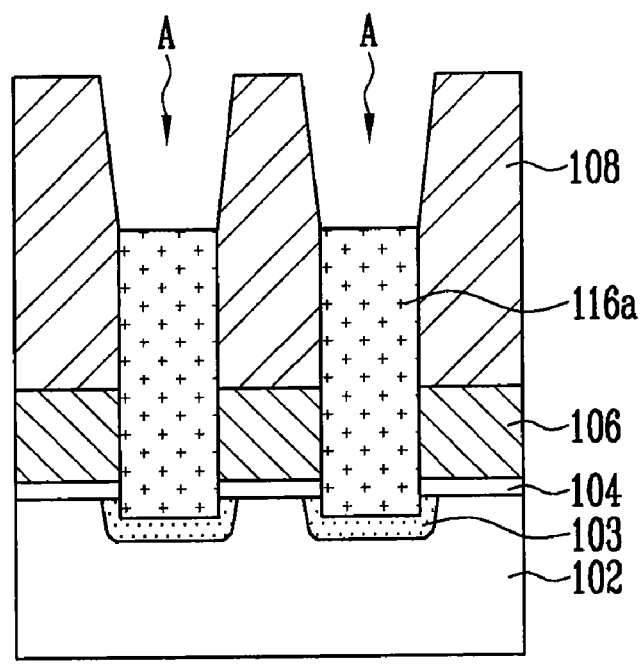

Referring to FIG. 1F, an etch process is performed on the first conductive layer 116 to thereby form first contact plugs 116a. In this case, the first conductive layer (refer to 116 of FIG. 1E) remains only on the lower portions of the contact holes A. Here, the first conductive layer (refer to 116 of FIG. 1E) is etched to a thickness of 1500 to 3000 angstroms, so a part of the contact hole A can be exposed. Further, a top surface of the insulating layer 108 can be removed simultaneously with the etch process of the first conductive layer (refer to 116 of FIG. 1E). Here, the insulating layer 108 at the upper portion of the contact hole A is exposed to the etch process longer than the insulating layer 108 at the lower portion of the contact hole A, so that the insulating layer 108 is further removed at the upper portion. Accordingly, the opening of the contact hole A becomes wide toward the upper portion of the contact hole A. This etch process can be performed using a mixed gas of $Cl_2$ gas, HBr gas and $O_2$ so that the etch selectivity of polysilicon and the etch selectivity of the oxide layer is in the range of 3:1 to 6:1.

Figure 1G:
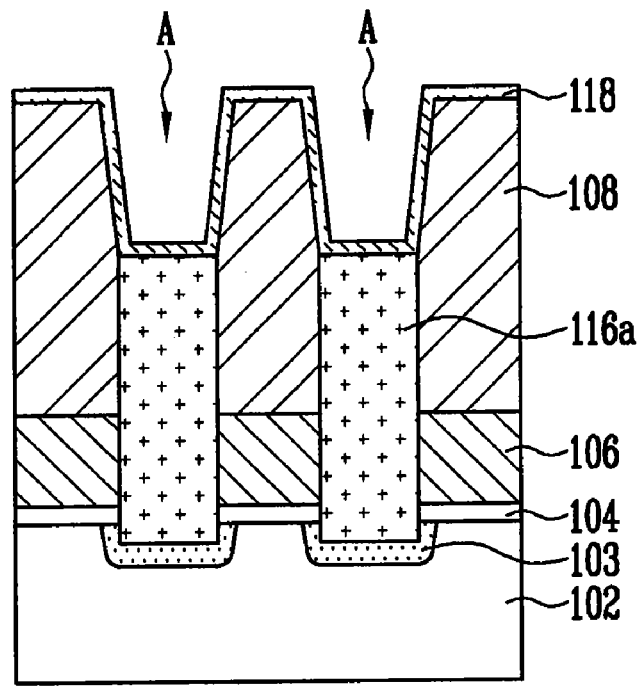

Referring to FIG. 1G, an etch passivation layer 118 is formed on the insulating layer 108 and the first contact plugs 116a including the contact holes A. The etch passivation layer 118 functions as a barrier to prevent the contact holes A from being damaged in a subsequent cleaning process. The etch passivation layer 118 can be formed of a LP-nitride layer formed using a LPCVD or a PE-nitride layer formed using a plasma CVD method. The etch passivation layer 118 can be formed to a thickness in which a step formed by the contact holes A can be maintained, for example, 30 to 120 angstroms.

Figure 1H:
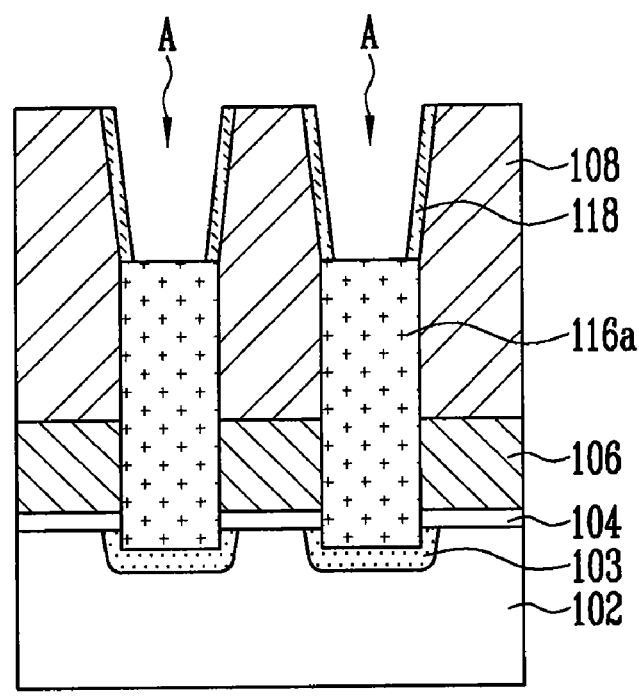

Referring to FIG. 1H, an etch process is performed on the etch passivation layer 118 such that the etch passivation layer 118 remains only on the sidewalls of the exposed contact holes A. Here, a thickness in which the etch passivation layer 118 remains can be in the range of 20 to 50 angstroms. The etch process performed on the etch passivation layer 118 can be formed using a mixed gas of $CF_x$-based gas, $CH_xF_y$-based gas, an inert gas and $O_2$. The $CF_x$-based gas can include $CF_4$ gas, the $CH_xF_y$-based gas can include $CHF_3$ gas or $CH_2F_2$ gas, and the inert gas can include Ar gas. Thereafter, a cleaning process is performed in order to remove impurities formed on the semiconductor substrate 102. Here, the exposed contact holes A can be protected by the etch passivation layer 118.

Figure 1I:
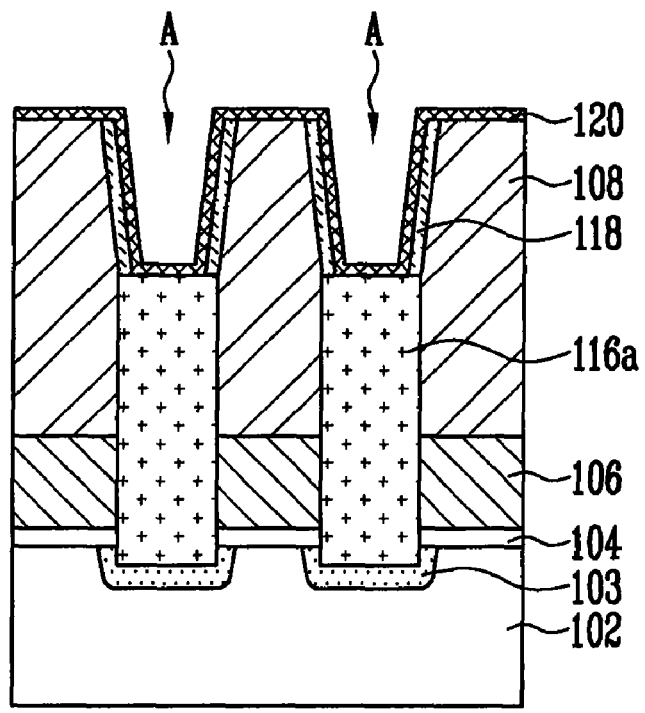

Referring to FIG. 1I, a barrier metal layer 120 is formed on the insulating layer 108 including the contact holes A. The barrier metal layer 120 can be formed to a thickness in which the step formed by the contact holes A can be maintained. The barrier metal layer 120 prevents a metal layer, which is formed on the barrier metal layer 120, from diffusing downward, thus reducing resistance. The barrier metal layer 120 can be formed of a stacked layer of Ti/TiN.

Meanwhile, in the present invention, the upper portion of the exposed contact hole A is wider than the lower portion. Thus, when the barrier metal layer 120 is formed, the barrier metal layer 120 can be formed easily without an overhang profile occurring on the contact holes A.

Figure 1J:
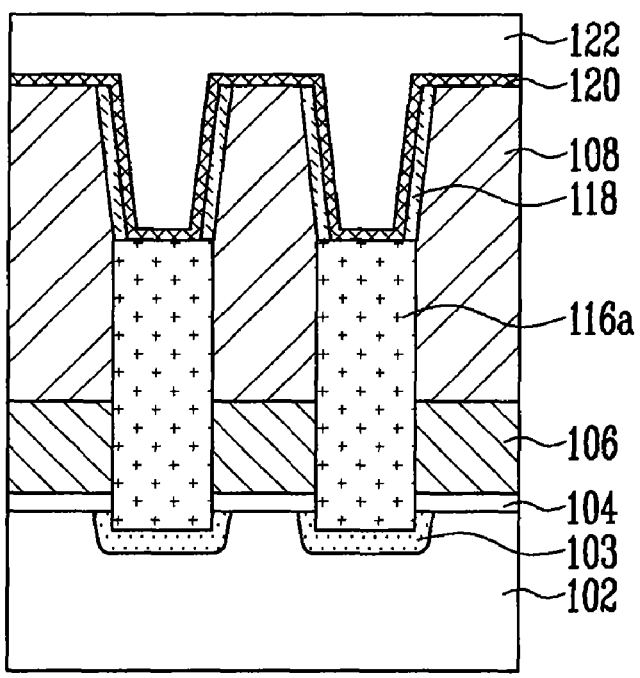

Referring to FIG. 1J, a second conductive layer 122 is formed on the barrier metal layer 120 including the contact holes A. The second conductive layer 122 can be formed of tungsten (W). Here, since the upper width of the contact hole A has been widened through the above processes, the barrier metal layer 120 can be deposited without the occurrence of an overhang profile. Further, the second conductive layer 122 can gap-fill the contact holes A without generating a void or seam when the contact holes A are gap-filled.

Figure 1K:
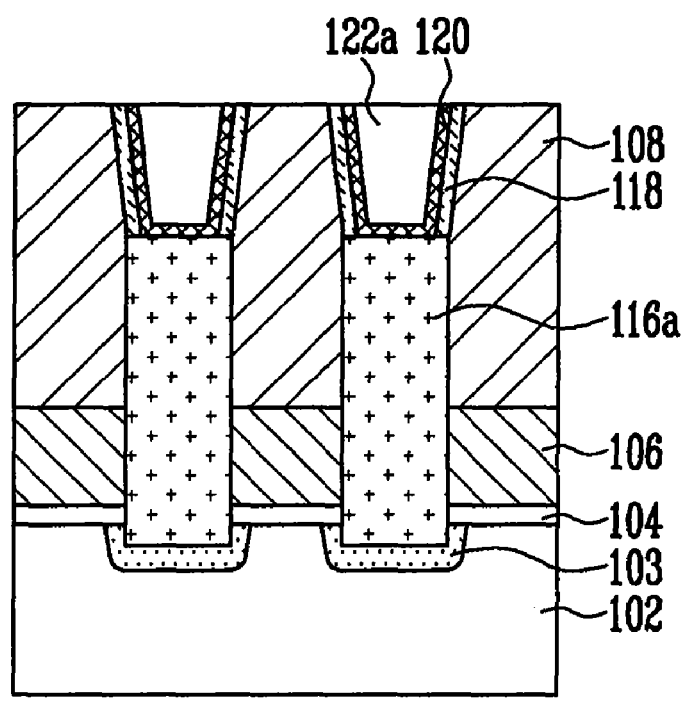

Referring to FIG. 1K, the second conductive layer (refer to 122 of FIG. 1J) and the barrier metal layer 120 formed over the insulating layer 108 are removed by performing a polishing process, such as a CMP (Chemical Mechanical Polishing) method, on the second conductive layer (refer to 122 of FIG. 1J). Contact plugs, including the first contact plugs 116a and the second contact plug 122a, are thereby formed.

As described above, according to the present invention, in an etch process of a conductive material layer gap-filled into contact holes formed in an insulating layer, an etch process for also etching parts of the insulating layer is carried out in order to widen upper portions of the contact holes. Accordingly, the process of gap-filling the contact holes with the conductive material can be facilitated.

The embodiment disclosed herein has been proposed to allow a person skilled in the art to easily implement the present invention, and the person skilled in the part may implement the present invention by a combination of various embodiments. Therefore, the scope of the present invention is not limited by or to the embodiment as described above, and should be construed to be defined only by the appended claims and their equivalents.

What is claimed is:

1. A method of forming a contact plug of a semiconductor device, the method comprising:
   forming an insulating layer over a semiconductor substrate;
   forming a contact hole in the insulating layer;
   forming a first conductive layer over the insulating layer including the contact hole, the first conductive layer filling the contact hole;
   etching the first conductive layer so that the first conductive layer remains at a lower portion of the contact hole and an upper portion of the contact hole is opened, wherein the etching is continued to etch the insulating layer of an opening of the contact hole so that the upper portion of the contact hole has increasing width going upwards; and
   forming a second conductive layer at the upper portion of the contact hole to form the contact plug, wherein the second conductive layer has increasing width going upwards.

2. The method of claim 1, wherein the insulating layer includes an oxide layer.

3. The method of claim 2, wherein the first conductive layer includes polysilicon.

4. The method of claim 3, wherein the etching step has an etch selectivity of polysilicon and an etch selectivity of the oxide layer is in the range of 3:1 to 6:1, wherein the same etching step is used to etch the first conductive layer and the insulating layer.

5. The method of claim 3, wherein the etching step uses a mixed gas of $Cl_2$ gas, HBr gas and $O_2$.

6. The method of claim 1, further comprising forming an etch passivation layer on sidewalls of the upper portion of the contact hole after the etching step.

7. The method of claim 6, wherein the etch passivation layer includes Plasma Enhanced (PE) nitride layer or a Low Pressure (LP) nitride layer.

8. The method of claim 1, further comprising forming a barrier metal layer on sidewalls of the upper portion of the contact hole after the etching step.

9. The method of claim 8, wherein the barrier metal layer comprises a stacked layer of Ti/TiN.

10. The method of claim 1, further comprising forming an etch-stop layer over the semiconductor substrate before forming the insulating layer.

11. The method of claim 10, wherein the etch-stop layer includes a LP nitride layer or a PE nitride layer.

12. The method of claim 1, wherein the insulating layer includes a (High Density Plasma oxide layer or a Plasma Enhanced Tetreathylorthosilicate oxide layer.

13. The method of claim 1, wherein when forming the contact hole, a mixed gas of gases $C_xF_y$, Ar and $O_2$ is used.

14. The method of claim 1, wherein forming the contact hole further comprises:
   forming a hard mask on the insulating layer;
   forming a passivation layer on the hard mask; and
   forming a contact hole through which a junction formed in the semiconductor substrate is exposed by etching a part of the hard mask, the passivation layer and the insulating layer.

15. A semiconductor device having a contact plug, the device comprising:
   an insulating layer formed over a semiconductor substrate;
   a contact hole formed in the insulating layer, wherein an upper portion of the contact hole has increasing width going upwards;
   a first conductive layer formed at a lower portion of the contact hole;
   a second conductive layer formed at the upper portion of the contact hole and having increasing width going upwards; and
   an etch passivation layer formed between the insulating layer and the second conductive layer.

16. The contact plug of claim 15, further comprising a barrier metal layer formed between the insulating layer and the second conductive layer.

* * * * *